United States Patent
Shin

(10) Patent No.: US 6,169,697 B1
(45) Date of Patent: Jan. 2, 2001

(54) MEMORY DEVICE WITH SENSING CURRENT-REDUCIBLE MEMORY CELL ARRAY

(75) Inventor: Sang Ho Shin, Kyoungki-do (KR)

(73) Assignee: Hyundai Electronics Industries Co., Ltd., Kyoungki-do (KR)

(*) Notice: Under 35 U.S.C. 154(b), the term of this patent shall be extended for 0 days.

(21) Appl. No.: 09/340,359

(22) Filed: Jun. 28, 1999

(30) Foreign Application Priority Data

Jun. 29, 1998 (KR) .................................................. 98-24910

(51) Int. Cl.[7] ....................................................... G11C 7/02
(52) U.S. Cl. ............................. 365/208; 365/51; 365/63; 365/190; 365/205; 365/230.03
(58) Field of Search ..................... 365/208, 190, 365/205, 230.03, 51, 63, 189.01, 230.01

(56) References Cited

U.S. PATENT DOCUMENTS

| | | | |
|---|---|---|---|
| Re. 33,694 | 9/1991 | McElroy | 365/149 |
| 4,658,377 | 4/1987 | McElroy | 365/149 |
| 4,704,705 | 11/1987 | Womack | 365/149 |
| 4,807,195 | 2/1989 | Busch et al. | 365/207 |
| 4,908,797 | 3/1990 | Mcelroy | 365/207 |
| 5,027,329 | 6/1991 | Foss | 365/230 |
| 5,222,047 | 6/1993 | Matsuda et al. | 365/230 |
| 5,371,714 | 12/1994 | Matsuda et al. | 365/230 |
| 5,377,151 | * 12/1994 | Komuro | 365/208 |
| 5,550,769 | 8/1996 | Hidaka et al. | 365/63 |
| 5,594,704 | * 1/1997 | Konishi et al. | 365/233 |
| 5,671,188 | 9/1997 | Patel et al. | 365/205 |
| 5,732,042 | 3/1998 | Sunaga et al. | 365/230 |

FOREIGN PATENT DOCUMENTS

| | | |
|---|---|---|
| 07326186 | 12/1995 | (JP) . |
| 10162580 | 6/1998 | (JP) . |

* cited by examiner

*Primary Examiner*—David Nelms
*Assistant Examiner*—Hoai V. Ho
(74) *Attorney, Agent, or Firm*—Ladas & Parry

(57) ABSTRACT

A memory device with skew-reducible memory cell arrangement, comprising a memory cell array being divided into a plurality of cell regions; a sense-amplifying means being comprised of a plurality of first sense amplifiers disposed in the upper side of the memory cell and a plurality of second sense amplifiers disposed in the lower side of the memory cell array;

a plurality of bit line pairs, each of bit line pairs being connected to the respective sense amplifiers and being divided into a plurality of bit line segment pairs; a connection means for connecting or disconnecting the bit line segment pairs to the sense amplifiers in accordance with a plurality of control signal pairs; and a control circuit for receiving a plurality of cell region selection signals for selecting corresponding one of the plurality of cell regions to generate the plurality of control signal pairs to the connection means.

14 Claims, 5 Drawing Sheets wordline
(WL0-WLj)

Sense Amplifier
(21-1),(21-2)

BL,/BL
(24,/24),(25,/25)

Control_1 &
/Control_1

MEMORY DEVICE WITH SENSING CURRENT-REDUCIBLE MEMORY CELL ARRAY

BACKGROUND OF THE INVENTION

This invention relates to a semiconductor memory device with a shared sense amplifier, and more particularly to a memory cell array arrangement capable of reducing consumption of sensing current.

FIG. 1 shows arrangement of memory cell block and sense amplifier. The memory cell block includes a plurality of memory cell arrays MCA0–MCA2 and sense amplifiers 10 connected to a pair of bit lines BL and /BL are arranged between adjacent memory cell arrays MCA0–MCA1 and MCA1–MCA2. In the respective memory cell arrays MCA0–MCA2, a plurality of word lines WL0 and WLi are arranged and a plurality of memory cells (not shown) are disposed at intersections of the word lines WL0 and WL1 and bit lines BL and /BL. The sense amplifier 10 has a folded bit line structure having a data sensing function and a data restore function using a voltage difference between bit line pair BL and /BL which are commonly connected to the adjacent memory cell arrays MCA0–MCA1 and MCA1–MCA2.

As shown in FIG.1, so as to maintain lay-out pitch of the sense amplifier 10 and to share the memory cell arrays, the shared sense amplifier scheme that the sense amplifiers are disposed in the upper and lower sides of the memory cell arrays MCA0–MCA2, is adopted in the prior memory device. That is, the sense amplifier is disposed between the adjacent memory cell arrays.

The operation of the prior sense amplifier will be described in more detail as follows. In the initial state, the bit lines BL and /BL have the bit line precharge voltage Vblp (0<Vblp<Vcc). In general, the bit line precharge Vblp is Vcc/2. If corresponding one of the word lines WL0–WL1 is enabled, the potential between bit line pair BL and /BL connected to selected one of the memory cells is varied by Δv.

Then, if the sense amplifier corresponding to the selected memory cell is enabled, one line of the bit line pair BL and /BL having a relatively higher potential becomes the power voltage Vcc and another line of the bit line pair BL and /BL having a relatively lower potential is becomes the ground voltage 0V so that the data of the selected memory cell is read out and the refresh operation that makes the cell data be Vcc or 0V.

Considering a storage capacitance Cs of the memory cell and a storage capacitance Cb of the bit line BL or /BL, the storage capacitance Cs of the memory cell is comparatively larger than the storage capacitance Cb of the bit line BL or /BL. In general, Cs=100 Cb. Therefore, most of current required to the sense amplifier is consumed in driving the bit lines BL and /BL.

So as to decrease the sensing current of the sense amplifier, the method for reducing the capacitance of the bit lines BL and /BL has been studied.

SUMMARY OF THE INVENTION

It is an object of the present invention to reduce sensing current with reduction of capacitance of bit line by dividing the bit line into plural bit line segments in each of memory cell arrays.

It is an aspect of the present invention to provide a memory device, comprising: a memory cell array being divided into a plurality of cell regions; a sense-amplifying means being comprised of a plurality of a first sense amplifiers disposed in the upper side of the memory cell and a plurality of second sense amplifiers disposed in the lower side of the memory cell array; a plurality of bit line pairs, each of bit line pairs being connected to the respective sense amplifiers and being divided into a plurality of bit line segment pairs; and a connection means for connecting or disconnecting the bit line segment pairs to the sense amplifiers in accordance with a plurality of control signal pairs.

The connection means includes a plurality of means, each of means being connected between adjacent bit line segment pairs and being for connecting the bit line segment pairs to corresponding one of sense amplifiers under the control of the control signal pairs. Each means of the connection means is comprised of a pass transistor group controlled by the control signal pairs, the pass transistor group in the respective connection means including a first pass transistor pair for connecting the corresponding one of sense amplifiers to corresponding ones of the bit line segment pairs, respectively under the control of the first control signal of the respective control signal pairs; and a second pass transistor pair for connecting the corresponding one of sense amplifiers to corresponding ones of the bit line segment pairs, respectively under the control of the second signal of the respective control signal pairs.

The memory device further comprises a control circuit for receiving a plurality of cell region selection signals for selecting corresponding one of the plurality of cell regions to generate the plurality of control signal pairs to the connection means. The control circuit includes a plurality of control means, each of control means for receiving corresponding one of cell region selection signals to generate corresponding pairs of the control signal pairs to each of means of the connection means. The last control means of the plurality of control means includes a first NOR gate for receiving the corresponding one of the cell region selection signals and a ground signal to generating the first control signal of a last control signal pair of the control signal pairs; and a first inverting gate for inverting an output of the first NOR gate to generate the second control signal of the last control signal pair and another control means, each includes a second NOR gate for receiving the respective corresponding one of the cell region selection signals and the respective first control signal generated from each of next control means to generate the first control signal of the respective control signal pairs; and a second inverting gate for inverting an output of the second NOR gate to generate the second control signal of the respective control signal pairs.

In the memory device, when one of the cell regions in the memory cell array is selected by the corresponding one of the cell region selection signals, of the control signal pairs generated from the first control means through the control means corresponding to a selected cell region, the first control signals is enabled and the second control signals is disabled and of the control signal pairs generated from another control means, the first control signals is disabled and the second control signals is enabled. In case of the bit line pairs connected to the plurality of first sense amplifiers, the first pass transistor pairs of pass transistor groups of a first connection means to connection means corresponding to the selected cell region of the plurality of connection mean are turned on by the first control signals of enable state generated from the corresponding control means and the first pass transistor pairs of another connection means in the plurality of the connection means are turned off by the first control signals of disable state generated from the corresponding control means. On the other hand, in case of the bit line pairs connected to the plurality of second sense amplifiers, the second pass transistor pairs of pass transistor groups of a first connection means to connection means corresponding to the selected cell region in the plurality of connection mean are turned off by the second control signals of disable state generated from the corresponding control means and the second pass transistor pairs of another connection means in the plurality of the connection means are turned on by the second control signals of enable state generated from the corresponding control means.

There is also provided to a memory device, comprising: a memory cell array being divided into a plurality of cell regions; a sense-amplifying means being comprised of a plurality of a first sense amplifiers disposed in the upper side of the memory cell and a plurality of second sense amplifiers disposed in the lower side of the memory cell array; a plurality of bit line pairs, each of bit line pairs being connected to the respective sense amplifiers and being divided into a plurality of bit line segment pairs; a connection means for connecting or disconnecting the bit line segment pairs to the sense amplifiers in accordance with a plurality of control signal pairs; and a control circuit for receiving a plurality of cell region selection signals for selecting corresponding one of the plurality of cell regions to generate the plurality of control signal pairs to the connection means.

There is still provided to a memory device, comprising: a memory cell array being divided into a plurality of cell regions; a sense-amplifying means being comprised of a plurality of a first sense amplifiers disposed in the upper side of the memory cell and a plurality of second sense amplifiers disposed in the lower side of the memory cell array; a plurality of bit line pairs, each of bit line pairs being connected to the respective sense amplifiers and being divided into a plurality of bit line segment pairs; a connection means for connecting or disconnecting the bit line segment pairs to the sense amplifiers in accordance with a plurality of control signal pairs; and a control circuit for receiving a plurality of cell region selection signals for selecting corresponding one of the plurality of cell regions to generate the plurality of control signal pairs to the connection means;

wherein connection means includes a plurality of means, each of means being connected between adjacent bit line segment pairs and being for connecting the bit line segment pairs to corresponding one of sense amplifiers under the control of the control signal pairs, the means including a first pass transistor pair for connecting the corresponding one of sense amplifiers to corresponding ones of the bit line segment pairs, respectively under the control of the first control signals of the respective control signal pairs; and a second pass transistor pair for connecting the corresponding one of sense amplifiers to corresponding ones of the bit line segment pairs, respectively under the control of the second control signals of the respective control signal pairs;

wherein the control signal includes a plurality of control means, each of control means for receiving corresponding one of cell region selection signals to generate corresponding pairs of the control signal pairs to each of means of the connection means; and wherein when one of the cell regions in the memory cell array is selected by the corresponding one of the cell region selection signals, in case of the bit line pairs connected to the plurality of first sense amplifiers, the first pass transistor pairs of pass transistor groups of a first connection means to connection means corresponding to the selected cell region of the plurality of connection mean are turned on by the first control signals of enable state generated from the corresponding control means and the first pass transistor pairs of another connection means in the plurality of the connection means are turned off by the first control signals of disable state generated from the corresponding control means; and in case of the bit line pairs connected to the plurality of second sense amplifiers, the second pass transistor pairs of pass transistor groups of a first connection means to connection means corresponding to the selected cell region in the plurality of connection mean are turned off by the second control signals of disable state generated from the corresponding control means and the second pass transistor pairs of another connection means in the plurality of the connection means are turned on by the second control signals of enable state generated from the corresponding control means.

There is still provided to a memory device, comprising: a plurality of memory cell arrays, each being divided into a plurality of cell regions; a sense-amplifying means being comprised of a plurality of a first sense amplifiers disposed in the upper side of the memory cell and a plurality of second sense amplifiers disposed in the lower side of the memory cell array; a plurality of bit line pairs, each of bit line pairs being connected to the respective sense amplifiers and being divided into a plurality of bit line segment pairs; a connection means for connecting or disconnecting the bit line segment pairs to the sense amplifiers in accordance with a plurality of control signal pairs; and a control circuit for receiving a plurality of cell region selection signals for selecting corresponding one of the plurality of cell regions to generate the plurality of control signal pairs to the connection means.

BRIEF DESCRIPTION OF DRAWINGS

The objects and features of the invention may be understood with reference to the following detailed description of an illustrative embodiment of the invention, taken together with the accompanying drawings in which.

DETAILED DESCRIPTION OF THE INVENTION

Figure 2:
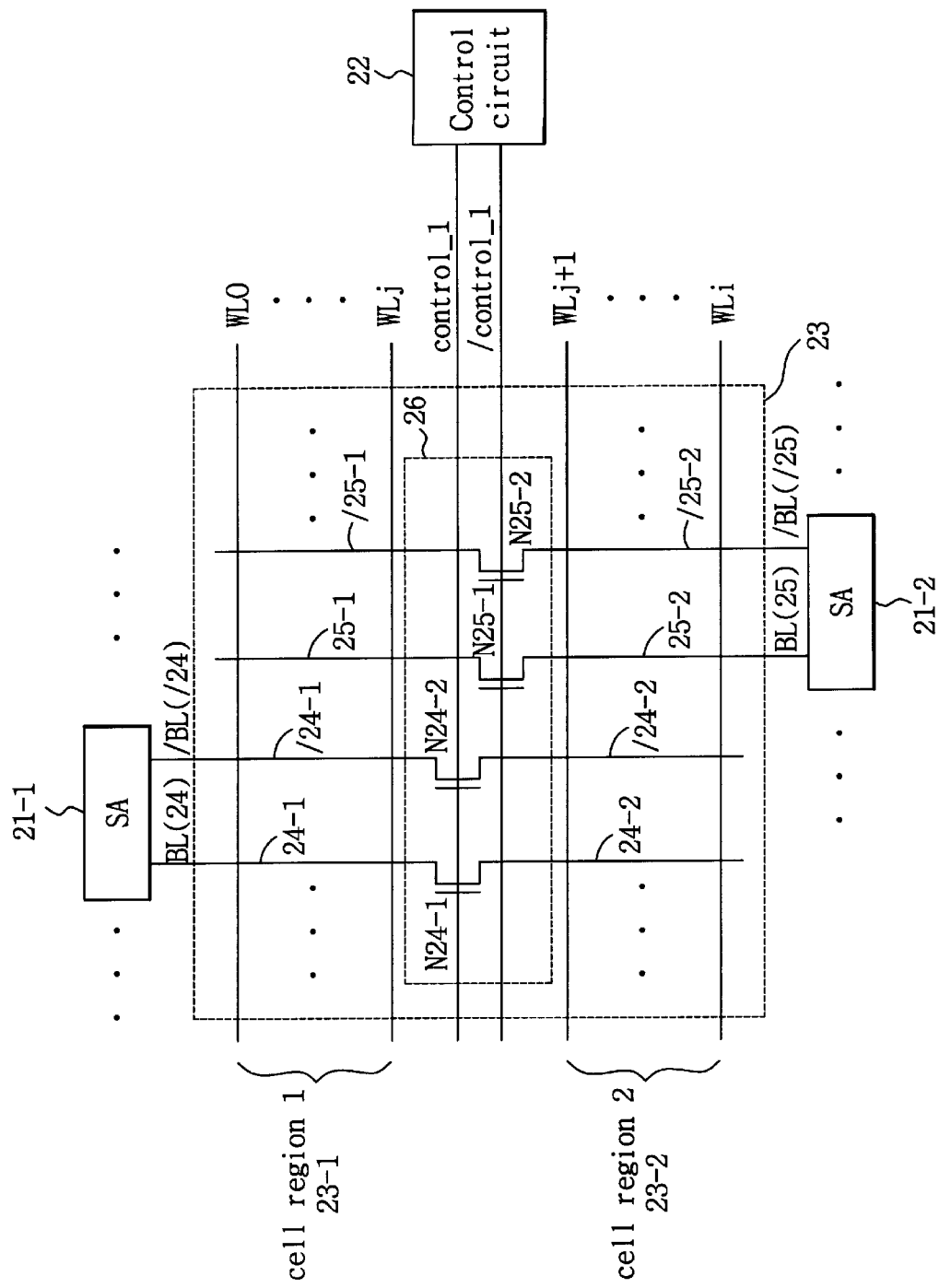
FIG. 2 is a diagram illustrating an arrangement of a memory cell array and a sense amplifier of a memory device in case where a bit line pairs are divided into two bit line segments in accordance with an embodiment of the present invention.

FIG. 2 shows an arrangement of a memory cell array and a sense amplifier of a memory device in accordance with an embodiment of the present invention. FIG. 2 illustrates an example that a memory cell array 23 is divided into two cell regions 23-1 and 23-2. In the upper and down sides of the memory cell array 23, sense amplifiers 21-1 and 21-2 are disposed with 4 bit line pitch, respectively and each of bit line pairs BL and /BL 24, /24 and 25, /25 is divided into two bit line segments 24-1, /24-1 and 24-2, /24-2, and 25-1, /25-1 and /25-1, /25-2.

The present invention includes a connection means 26 for connecting the bit line segments 24-1 and 24-2, /24-1 and /24-2, 25-1 and 25-2, and /25-1 and /25-2 in accordance with a pair of control signals control_1 and /control_1 based on the selection of the cell regions 23-1 and 23-2. The connection means 26 includes pass transistor pairs N24-1, N24-2 and N25-1, N25-2.

The memory device of the present invention further includes a control circuit for controlling the pass transistor pairs N24-1, N24-2 and N25-1, N25-2 of the connection means 26. The control circuit 22 generates a first control signal control_1 and a second control signal /control_1 where the first control signal control_1 is inverted, by using a selection signal for selecting for corresponding one of the plural cell regions 23-1 and 23-2 of the memory cell array 23.

Figure 3:
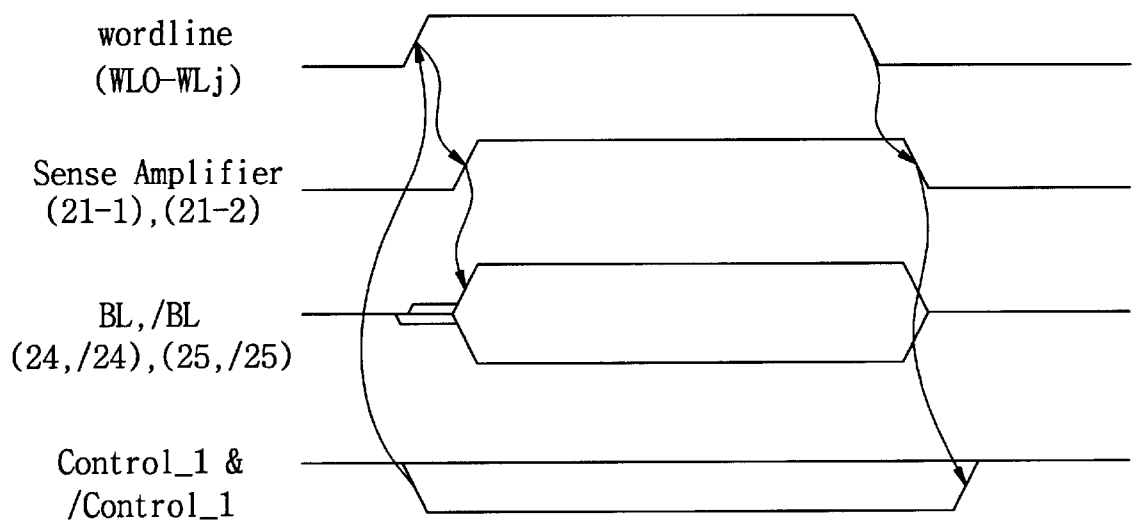
FIG. 3 is a timing diagram illustrating the operation of the memory device in FIG. 2.

The operation of the memory device having the above construction will be described in more detail with reference to a timing diagram of FIG. 3. In case where the first cell region 23-1 is selected by decoding a row address signal through a row decoder(not shown in drawings), the control circuit 22 generates the first control signal control_1 of low state and the second control signal /control_1 of high state of word line enable potential Vpp, respectively in accordance with the selection signal for selecting the first cell region 23-1. Therefore, of the pass transistor pairs in the connection means 26, the NMOS pass transistor pair N24-1 and N24-2 corresponding to the sense amplifier 21-1 which is disposed in the upper side of the memory cell array 23 are turned off and the NMOS pass transistor pair N25-1 and N25-2 corresponding to the sense amplifier 21-2 disposed in the lower side of the memory cell array 23 are turned on.

If corresponding one of word lines WL0–WLj arranged in the first cell region 23-1 is enabled, of data read from memory cells of the first memory cell region 23-1 in the memory cell array 23, data read from corresponding memory cell connected to the bit line pair 24 and /24 is provided to the sense amplifier 21-1 arranged in the upper side of the memory cell array 23 through the bit line segment pair 24-1 and /24-1.

On the other hand, the pass transistor pair N25-1 and N25-2 are turned on to make a data path. data read from corresponding memory cell connected to the bit line pair 25 and /25 is provided to the sense amplifier 21-2 arranged in the lower side of the memory cell array 23 through the pass transistor pair N25-1 and N25-2 of the connection means 26 and the bit line segment pairs 25-1, /25-1 and 25-2, /25-2. At this time, the pass transistor pair N24-1 and N24-2 are turned off to disconnect the bit line segment pair 24-2 and /24-2 with the sense amplifier 21-1, so that the bit line segment pair 24-2 and /24-2 are not involved in the data sensing operation.

Figure 1:
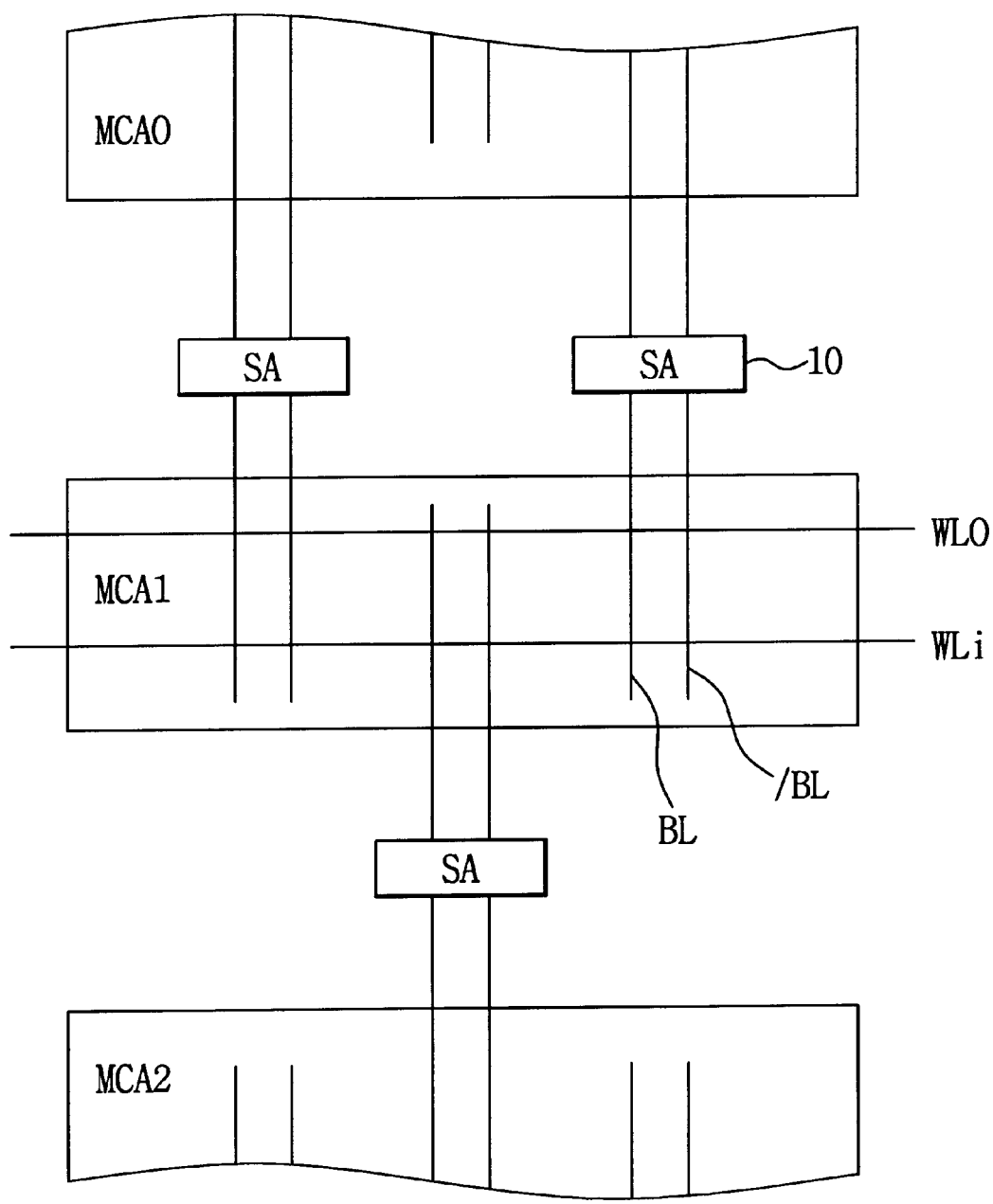
FIG. 1 is a diagram illustrating an arrangement of a memory cell array and a sense amplifier in the prior memory device.

Hereinafter, the sense amplifiers 21-1 and 21-2 are enables and then the data sensing operation is carried out. Thus, the data of the bit line pairs 24, /24 and 25, /25 connected to the sense amplifier 21-2 is sensed so that the data of the memory cell is read out. The bit line pair 25 and /25 connected to the sense amplifier 21-2 also have the bit line capacitance of Cb as the prior memory device shown in FIG. 1 to be driven with Vcc and 0V. However, in the preferred embodiment, of bit line pair 24 and /24 connected to the sense amplifier 21-1, only the bit line segment pair 24-1 and /24-1 are involved in the data sensing operation so that the bit line pair 24 and /24 have the bit line capacitance of ½ Cb to be driven with Vcc and 0V, thereby reducing the current consumption in the data sensing operation as compared with the prior art.

Amount of the sensing current in the data sensing operation of the preferred memory device of the present invention and in the data sensing operation of the prior memory device is as follows. Suppose that the plurality of sense amplifiers 21 are arranged with a half in the upper and lower sides of the memory cell array 23, respectively and a number of column of the memory cell array 23 is No_col. An amount of the charge dissipated in sensing is as follows.

The total amount C of the charge charged in the bit line pair BL and /BL is expressed with the following equation.

C=a number of sense amplifiers disposed in the upper side of the memory cell array 23×potential variation×load capacitance+a number of sense amplifiers disposed in the lower side of the memory cell array 23×potential variation× load capacitance At this time, suppose that the pass transistor pairs N24-1, N24-2 and N25-1, N25-2 of the connection means 26 controlled by the pair of the control signals control_1 and /control_1 are disposed at the center of the memory cell array so that the respective bit line segment pair has the same length and the bit line precharge voltage Vblp thereof is Vcc/2.

Accordingly, the total amount C1 of the charge charged in the bit line pair BL and /BL in the memory device of the present invention will be expressed by the following equation (1).

$$C1 = No\_col/2 \times Vcc/2 \times Cb/2 + No\_col/2 \times Vcc/2 \times Cb \qquad (1)$$

$$= 3/8 \times (No\_col \times Vcc \times Cb)$$

On the other hand, the total amount C2 of the charge charged in the bit line pair BL and /BL in the memory device of the prior art will be expressed by the following equation (2).

$$C2 = No\_col/2 \times Vcc/2 \times Cb + No\_col/2 \times Vcc \times Cb \qquad (2)$$

$$= 1/2 \times (No\_col \times Vcc \times Cb)$$

As compared with equations (1) and (2), the present memory device can reduce the sensing current rather than the prior memory device.

Accordingly, the present invention can reduce the sensing current by ¾ of sensing current of the prior memory device by constructing the memory device that the memory cell array is divided into two cell regions and the respective bit line pairs are divided into two bit line segment pairs and then the pass transistor pairs controlled by the pair of control signals are disposed at the center of the memory cell array 23.

Figure 4:
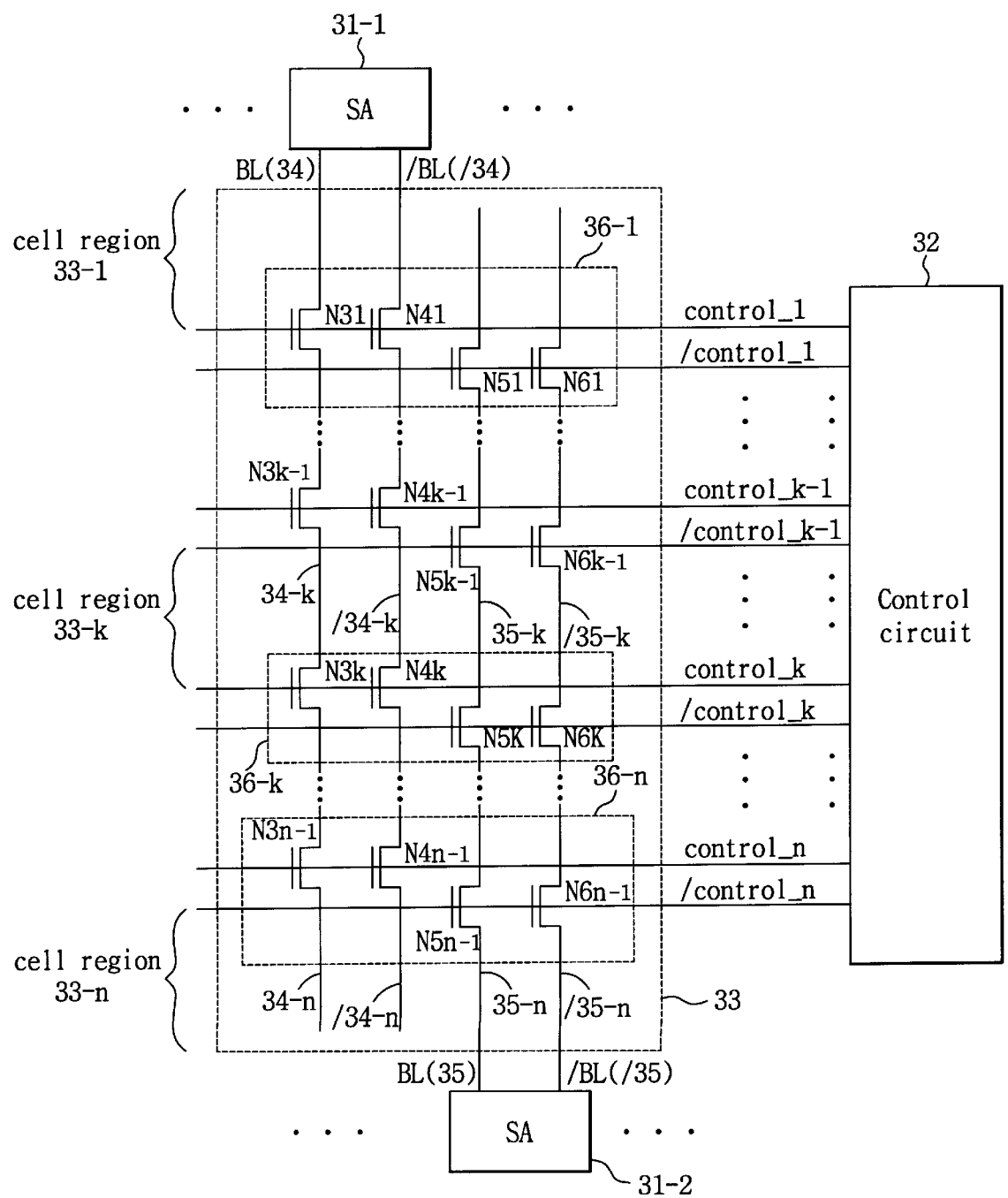
FIG. 4 is a diagram illustrating an arrangement of a memory cell array and a sense amplifier of a memory device in case where bit line pairs are divided into plural bit line segments in accordance with another embodiment of the present invention.

FIG. 4 shows another arrangement of a memory cell array and a sense amplifier in accordance with another embodiment of the present invention. FIG. 4 shows an example of the present memory device that a memory cell array 33 is n cell regions 33-1 through 33-n.

In the memory device of another embodiment, the sense amplifiers 31-1 and 31-2 are arranged in the upper and lower sides of the memory cell array 33 with 4 bit line pitch and the bit line pairs BL and /BL 34, /34 and 35, /35 are divided into n bit line segment pairs 34-1, /34-1 to 34-n, /34-n, and 35-1, /35-1 to 35-n and /35-n. The memory device includes a connection means 36 for connecting adjacent two bit line segments of the divided bit line segment pairs in accordance with a pair of control signals control_1, /control_1 to control_n, /control_n on the basis of selection of the cell regions 33-1 to 33-n.

The connection means 36 includes a plurality of means 36-1 to 36-n for connecting adjacent two bit line segment pairs of the divided bit line segment pairs 34-1–34-n and /34-1–/34-n and 35-1–35-n and /35-1–/35-n in accordance with the respective control signal pairs control_1, /control_1 to control_n, /control_n. Each of means 36-1 to 36-n in the connection means 36 includes a pass transistor group for connecting the adjacent bit line segment pairs in accordance with the respective control signal pairs control_1, /control_1 and control_n, /control_n.

The pass transistor group in each means 36-1 to 36-n of the connection means 36 includes a first pass transistor pair N31, N41 to N3n, N4n for connecting adjacent bit line segment pairs of the bit line pair 34 and /34 connected to the sense amplifier 31-1 which are arranged in the upper side of the memory cell array 33 of bit line pairs BL, /BL 34, /34 and 35, /35 in accordance with each of first control signals control_1 to control_n of the respective control signal pairs control_1, /control_1 to control_n, /control_n and a second pass transistor pair N51, N61 to N5n, N6n for connecting adjacent bit line segment pairs of the bit line pair 35 and /35 connected to the sense amplifier 31-2 which are arranged in the lower side of the memory cell array 33 of the bit line pairs BL, /BL 34, /34 and 35, /35 in accordance with each of second control signals /control_1 to /control_n of the respective control signals control_1, /control_1 to control_n, /control_n.

The memory device of another embodiment further includes a control circuit 32 for generating the pairs of control signals control_1, /control_1 to control_n, /control_n to control the pass transistor pairs N31–N41 to N3n–N4n and N51–N61 to N5n–N6n of the connection means 36.

Figure 5:
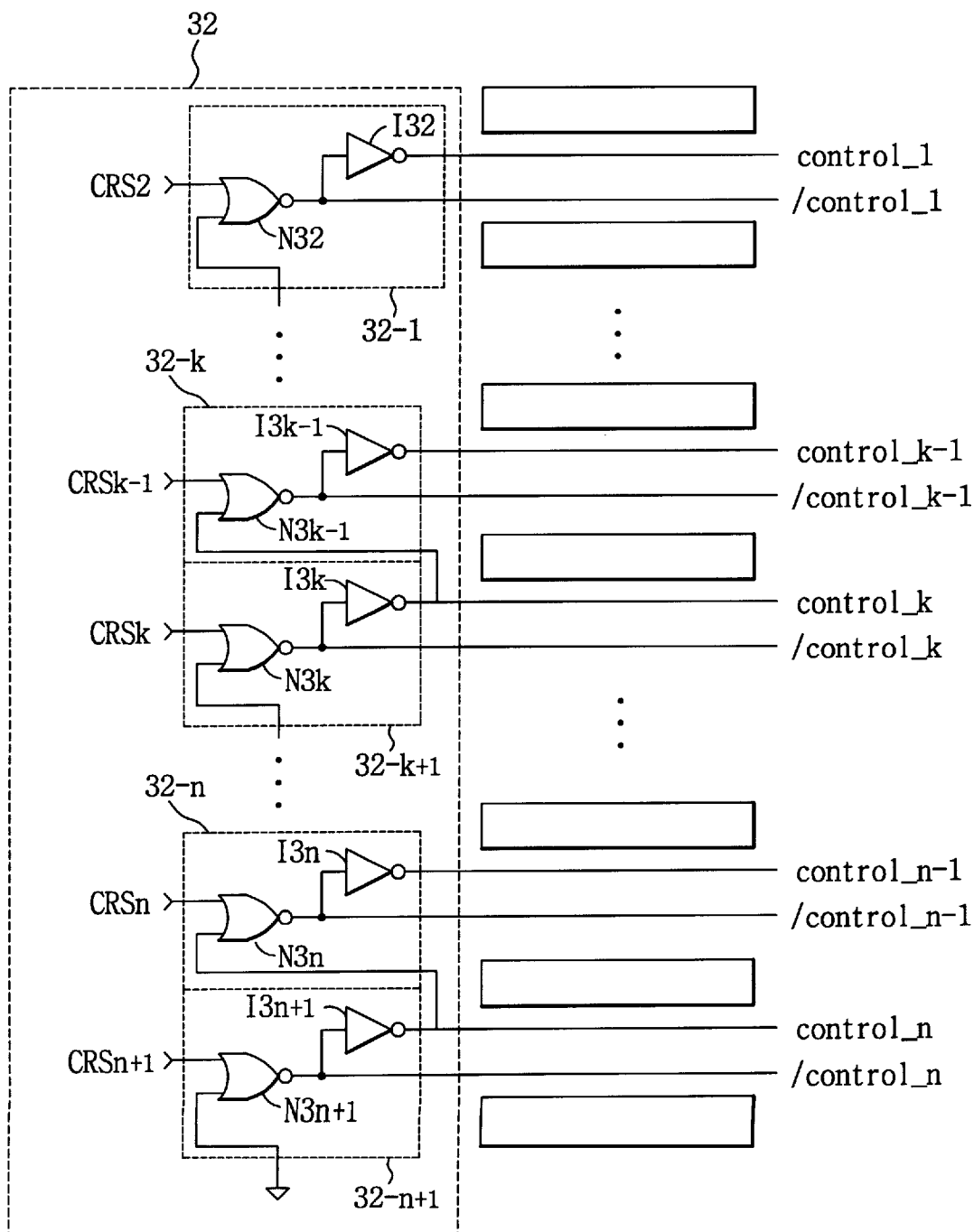
FIG. 5 is a detailed circuit diagram of a control circuit in the memory device of FIG. 4.

The control circuit 32 of another embodiment, as shown in FIG. 5, includes a plurality of control means 32-1 to 32-n+1, each of control means 32-1 to 32-n+1 for receiving a selection signal CRS2 to CRSn+1 for selecting corresponding one of plural cell regions 33-1 to 33-n of the memory cell array 33 and generating each of the pairs of control signals to each of means 36-1 to 36-n of the connection means 36.

Of plural control means 32-1 to 32-n+1, the last control means for generating the last control signal pair control_n and /control_n includes a NOR gate N3n+1 for receiving the selection signal CRSn+1 and a ground signal of 0V as two input signals to generate the first control signal control_n of the last control signal pair control_n and /control_n and an inverting gate I3n+1 for inverting an output of the NOR gate N3n+1 to generate the second control signal /control_n of the last control signal pair control_n and /control_n.

Of plural control means 32-1 to 32-n+1, each of the remaining control means 32-1 to 32-n for generating the control signal pairs control_1, /control_1 to control_n-1, /control_n-1 includes a NOR gate N32–N3n for receiving the respective selection signal CRS2–CRSn for selecting corresponding one of plural cell regions 33-2 to 33-n and the respective first control signal control_1 to control_n-1 of the control signal pairs control_2, /control_2 to control_n, /control_n generated from each of the next control means 32-2 to 32-n+1 and for generating the respective first control signals control_1 to control n-1 of the control signal pairs control_1, /control_1 to control_n-1, /control_n-1 and an inverting gate I32–I3n+1 for inverting an output of the NOR gate N32-N3n to generate the respective second control signals /control_1 to /control_n-1 of the control signal pairs control_1, /control_1 to control_n-1, /control n-1.

The operation of the memory device in another embodiment will be described in more detail as follows. If the memory cell array 33 is basically divided into m cell regions, it set i value so as to be $2^i=m$ using the upper i address of a row address. If the i upper row address is decoded, all $2^i$ decoding signals are generated and the $2^i=m$ decoding signals are used for the cell region selection signals.

If corresponding one of word lines arranged in the cell region 33-k is enabled, only the selection signal CRSk for selecting the cell region 33-k of the memory cell array 33 becomes high state and another selection signals CRS2–CRSk-1 and CRSk+1–CRSn+1 becomes low state. According to this, of plural control signal pairs control_1, /control_1 to control_n, /control_n, the first control signals control_1–control_k become high state of Vpp and the remaining control signals control_k+1 to control_n become low state. On the other hand, the second control signals /control_1 –/control_k become low state and the remaining second control signals /control_k+1 /control_n become high state of Vpp.

Accordingly, of the pass transistor group of the connection means 36-1 to 36-k, the pass transistor pairs N31, N41 to N3k, N4k for connecting the bit line segment pairs 34-1–34-k-1 and /34-1–/34-k-1 of the bit line pair 34 and /34 connected to the sense amplifier 31-1 arranged in the upper side of the memory cell array 33 are turned off by the first control signals control_1–control_k-1 and the pass transistor pairs N3k+1, N4k+1 to N3n-1, N4n-1 are turned on by the first control signals control_k–control_n for connecting the bit line segment pairs 34-k–34-n and /34-k–/34-n.

On the other hand, of the pass transistor group of the connection means 36-1 to 36-k, the pass transistor pairs N51, N61 to N5k, N6k for connecting the bit line segment pairs 35-1–35-k-i and /35-1–/35-k-1 of the bit line pair 35 and /35 connected to the sense amplifier 31-2 disposed in the lower of the memory cell array 33 are turned off by the second control signal /control_1–/control_k-1 and the pass transistor pairs N5k+1, N6k+1 to N5n-1, N6n-1 for connecting the bit line segments 35-k–35-n to /35-k–35-n are turned on by the second control signals control_k–control_n.

Accordingly, of the first control signals control_1 to control_n for bit line pair 34 and /34 connected to the sense amplifier 31-1 disposed in the upper side of the memory cell array 33, 0V is applied to the first control signals control_1 to control_k-1 and Vpp is applied to the following first control signals control_K to control_n. Of the second control signals /control_1 to control_n for bit line pair 35 and /35 connected to the sense amplifier 31-2 disposed in the lower side of the memory cell array 33, Vpp is applied to the second control signals /control_1 to /control_k-1 and 0V is disposed to the following second control signals control_k to control_n.

Therefore, Of the NMOS pass transistor pairs for dividing the bit line pair 34 and /34 connected to the sense amplifier 31-1, the pass transistor pairs N31, N41 to N3k-1, N4k-1 are turned on and the pass transistor pairs N3k, N4k to N3n-1, N4n-1 are turned off. Of the NMOS pass transistor pairs for dividing the bit line pair 35 and /35 connected to the sense amplifier 31-2, the pass transistor pairs N51, N61 to N5k-1, N6k-i are turned on and the pass transistor pairs N5k, N6k to N5n-1, N6n-1 are turned off.

In case where data is sensed through the data path as above described, the required amount of charge C3 is as follows.

$$C3 = No\_col/2 \times Vcc/2 \times Cb \times k/(n+1) + No\_col/2 \times Vcc/2 \times Cb \times (n-k+2)/(n+1)$$

The arrangement of the memory device can reduce the sensing current by (n+2) / (2n+2) as compared with the arrangement of the prior memory device.

The data applied to the upper sense amplifier 31-1 are read out from the cell regions above the enabled cell region and the data applied to the lower sense amplifier 31-2 are read out from the cell regions below the enabled cell region.

According to the present invention, the bit line pairs are divided into the plural bit line segments so that the portions of the divided bit line segments involved in the data sensing makes the data path but another bit line segments not involved in the data sensing do not make the data path. Therefore, the bit line capacitance can be reduced and the sensing current can be reduced.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A memory device, comprising:
   a memory cell array being divided into a plurality of cell regions;
   a sense-amplifying means being comprised of a plurality of first sense amplifiers disposed in an upper side of the memory cell array and a plurality of second sense amplifiers disposed in a lower side of the memory cell array;
   a plurality of bit line pairs, each of bit line pairs being connected to corresponding one of the sense amplifiers and being divided into a plurality of bit line segment pairs;
   a connection means for connecting or disconnecting the bit line segment pairs to the sense amplifiers in accordance with a plurality of control signal pairs; and
   a control circuit for receiving the plurality of cell region selection signals for selecting corresponding one of the plurality of cell regions to generate the plurality of control signal pairs to the connection means.

2. The memory device as claimed in claim 1, wherein the connection means includes a plurality of means, each of means being connected between adjacent two bit line segment pairs and being for connecting the adjacent bit line segment pairs to corresponding one of sense amplifiers under the control of the control signal pairs.

3. The memory device as claimed in claim 2, wherein each of means of the connection means is comprised of a pass transistor group controlled by corresponding one of the control signal pairs.

4. The memory device as claimed in claim 3, wherein the pass transistor group in the connection means includes:
   first pass transistor pairs for connecting the corresponding one of the first sense amplifiers to corresponding one of the bit line segment pairs, respectively under the control of first control signals of respective control signal pairs; and
   second pass transistor pairs for connecting the corresponding one of the second sense amplifiers to corresponding one of the bit line segment pairs, respectively under the control of second control signals of respective control signal pairs.

5. The memory device as claimed in claim 4, further comprising a control circuit for receiving a plurality of cell region selection signals for selecting corresponding one of the plurality of cell regions to generate the plurality of control signal pairs to the connection means.

6. The memory device as claimed in claim 4, wherein the control signal circuit includes a plurality of control means, each of control means for receiving corresponding one of cell region selection signals to generate corresponding one of the control signal pairs to each of means of the connection means.

7. The memory device as claimed in claim 6, wherein a last control means of the plurality of control means includes:
   a first NOR gate for receiving a cell region selection signal for selecting a last cell region of the cell regions and a ground signal to generate the first control signal of a last control signal pair of the control signal pairs; and
   a first inverting gate for inverting an output of the first NOR gate to generate the second control signal of the last control signal pair.

8. The memory device as claimed in claim 7, wherein another means, each includes:
   a second NOR gate for receiving the respective corresponding one of the cell region selection signals and the respective first control signal generated from each of following control means to generate the first control signal of the respective control signal pair; and
   a second inverting gate for inverting an output of the second NOR gate to generate the second control signal of the respective control signal pair.

9. The memory device as claimed in claim 8, wherein when one of the cell regions in the memory cell array is selected by the corresponding one of the cell region selection signals, of the control signal pairs generated from the first control means through the control means corresponding to a selected cell region, the first control signals are enabled and the second control signals are disabled and of the control signal pairs generated from another control means, the first control signals are enabled and the second control signals are enabled.

10. The memory device as claimed in claim 9, wherein when the one of the cell regions in the memory cell array is selected by the corresponding one of the cell region selection signals, in case of the bit line pairs connected to the plurality of the first sense amplifiers, the pass transistor pairs of pass transistor groups of a first connection means to connection means corresponding to the selected cell region of the plurality of connection means are turned on by the first control signals of enable state generated from corresponding control means and the first pass transistor pairs of another connection means in the plurality of the connection means are turned off by the first control signals of disable state generated from corresponding control means.

11. The memory device as claimed in claim 10, wherein when the one of the cell regions in the memory cell array is selected by corresponding one of the cell region selection signals, in case of the bit line pairs connected to the plurality of the second sense amplifiers, the second pass transistor pairs of pass transistor groups of the first connection means to connection means corresponding to the selected cell region in the plurality of connection means are turned off by the second control signals of disable state generated from the corresponding control means and the second pass transistor pairs of another connection means in the plurality of the connection means are turned on by the second control signal of enable state generated from the corresponding control means.

12. A memory device, comprising:

a memory cell array being divided into a plurality of cell regions;

a sense-amplifying means being comprised of a plurality of first sense amplifiers disposed in an upper side of the memory cell array and a plurality of second sense amplifiers disposed in a lower side of the memory cell array;

a plurality of bit line pairs, each of bit line pairs being connected to corresponding one of the sense amplifiers and being divided into a plurality of bit line segment pairs;

a connection means for connecting or disconnecting the bit line segment pairs to the sense amplifiers in accordance with a plurality of control signal pairs, each of means of the connection means being connected between adjacent bit line segment pairs and being comprised of a pass transistor group controlled by corresponding one of the control signal pairs; and a control circuit for receiving a plurality of cell region selection signals for selecting corresponding one of the plurality of cell regions to generate the plurality of control signal pairs to the connection means, the control circuit including a plurality of control means, each of control means for receiving corresponding one of cell region selection signals to generate corresponding one of the control signal pairs to each of means of the connection means.

13. A memory device, comprising:

a memory cell array being divided into a plurality of cell regions;

a sense-amplifying means being comprised of a plurality of first sense amplifiers disposed in an upper side of the memory cell array and a plurality of second sense amplifiers disposed in a lower side of the memory cell array;

a plurality of bit line pairs, each of bit line pairs being connected to corresponding one of the sense amplifiers and being divided into a plurality of bit line segment pairs;

a connection means for connecting or disconnecting the bit line segment pairs to the sense amplifiers in accordance with a plurality of control signal pairs; and a control circuit for receiving a plurality of cell region selection signals for selecting corresponding one of the plurality of cell regions to generate the plurality of control signal pairs to the connection means, wherein the connection means includes a plurality of means, each of means being connected between adjacent bit line segment pairs and being for connecting the bit line segment pairs to corresponding one of sense amplifiers under the control of the control signal pairs, the means including first pass transistor pairs for connecting the corresponding one of the first sense amplifiers to corresponding one of the bit line segment pairs, respectively under the control of first control signals of respective control signal pairs; and second pass transistor pairs for connecting the corresponding one of the second sense amplifiers to corresponding one of the bit line segment pairs, respectively under the control of second control signals of respective control signal pairs;

wherein the control circuit includes a plurality of control means, each of control means for receiving corresponding one of cell region selection signals to generate corresponding one of the control signal pairs to each of means of the connection means; and wherein when the one of the cell regions in the memory cell array is selected by the corresponding one of the cell region selection signals, in case of the bit line pairs connected to the plurality of the first sense amplifiers, the pass transistor pairs of pass transistor groups of a first connection means to connection means corresponding to the selected cell region of the plurality of connection means are turned on by the first control signals of enable state generated from corresponding control means and the first pass transistor pairs of another connection means in the plurality of the connection means are turned off by the first control signals of disable state generated from corresponding control means; and in case of the bit line pairs connected to the plurality of the second sense amplifiers, the second pass transistor pairs of pass transistor groups of the first connection means to connection means corresponding to the selected cell region in the plurality of connection means are turned off by the second control signals of disable state generated from the corresponding control means and the second pass transistor pairs of another connection means in the plurality of the connection means are turned on by the second control signals of enable state generated from the corresponding control means.

14. A memory device, comprising:

a plurality of memory cell arrays, each being divided into a plurality of cell regions;

a sense-amplifying means being comprised of a plurality of a first sense amplifiers disposed in the upper side of the memory cell and a plurality of second sense amplifiers disposed in the lower side of the memory cell array;

a plurality of bit line pairs, each of bit line pairs being connected to the respective sense amplifiers and being divided into a plurality of bit line segment pairs;

a connection means for connecting or disconnecting the bit line segment pairs to the sense amplifiers in accordance with a plurality of control signal pairs; and a control circuit for receiving a plurality of cell region selection signals for selecting corresponding one of the plurality of cell regions to generate the plurality of control signal pairs to the connection means.

* * * * *